United States Patent
Yang et al.

(10) Patent No.: US 10,299,415 B1
(45) Date of Patent: May 21, 2019

(54) WATER BARRIER STRUCTURE FOR DISPLAY UNIT

(71) Applicant: LITEMAX ELECTRONICS INC., New Taipei (TW)

(72) Inventors: Tien-Teng Yang, New Taipei (TW); Ling-Chi Lo, New Taipei (TW)

(73) Assignee: LITEMAX ELECTRONICS INC. (TW)

( * ) Notice: Subject to any disclaimer, the term of this patent is extended or adjusted under 35 U.S.C. 154(b) by 0 days.

(21) Appl. No.: 15/817,400

(22) Filed: Nov. 20, 2017

(51) Int. Cl.
*H05K 7/20* (2006.01)
*H05K 5/02* (2006.01)
*H05K 5/00* (2006.01)

(52) U.S. Cl.
CPC ....... *H05K 7/20972* (2013.01); *H05K 5/0217* (2013.01); *H05K 7/20181* (2013.01); *H05K 5/0017* (2013.01)

(58) Field of Classification Search
CPC ....................... H05K 7/20181; H05K 7/20972
USPC .................... 165/80.2; 361/695; 454/184
See application file for complete search history.

(56) References Cited

U.S. PATENT DOCUMENTS

| | | | | |
|---|---|---|---|---|
| 6,643,130 B1 * | 11/2003 | DeMarchis | ........ | H05K 7/20181 165/80.3 |
| 8,593,815 B2 * | 11/2013 | Claassen | ............ | H05K 7/20736 312/223.2 |
| 8,668,560 B2 * | 3/2014 | Zuzek | ....................... | B67D 7/84 361/695 |
| 2008/0222932 A1 * | 9/2008 | Yun | ..................... | H05K 7/20972 40/541 |
| 2010/0015904 A1 * | 1/2010 | Yeh | .................... | B01D 46/0005 454/184 |
| 2011/0116000 A1 * | 5/2011 | Dunn | ................. | G02F 1/133382 349/58 |
| 2012/0298330 A1 * | 11/2012 | Mysse, III | ........... | H05K 5/0213 165/96 |
| 2012/0307449 A1 * | 12/2012 | Hsu | .................... | H05K 7/20572 361/692 |
| 2013/0171921 A1 * | 7/2013 | Nakamichi | .......... | H05K 5/0213 454/184 |
| 2015/0147951 A1 * | 5/2015 | Funada | .................. | H05K 7/206 454/184 |

* cited by examiner

*Primary Examiner* — Allen J Flanigan
(74) *Attorney, Agent, or Firm* — Schmeiser, Olsen & Watts, LLP

(57) ABSTRACT

A water barrier structure for display unit is arranged on one lateral side of a casing of a display unit. In the casing there are received an illuminating module and a display module of the display unit, the lateral side is provided with at least one air inlet and at least one air outlet. The water barrier structure includes at least one intake fan mounted in the at least one air inlet; at least one exhaust fan mounted in the at least one air outlet; and a plurality of water-stop caps used to cover the at least one air inlet and the at least one air outlet. With the specially structured intake fan, exhaust fan and water-stop caps, the water barrier structure can provide good water barrier effect while allows heat in the casing produced by the display unit to be effectively removed from the casing through air convection.

8 Claims, 5 Drawing Sheets

WATER BARRIER STRUCTURE FOR DISPLAY UNIT

FIELD OF THE INVENTION

The present invention relates to a water barrier structure for display unit, and more particularly, to a water barrier structure that is used on a display unit to prevent water from entering into the display unit while allows heat dissipation from the display unit.

BACKGROUND OF THE INVENTION

Display units are now very popular, and demand for outdoor use of display units is on the rise. However, to use the display units outdoors, it is necessary to overcome the problem of intrusion of rainwater into the display units, lest the display units should be damaged by rainwater and failed.

A conventional way to prevent the intrusion of rainwater into the outdoor display units is to form a hermetic structure for the display units by using rubber gaskets. However, since the currently available rubber gaskets do not provide any heat dissipation effect, the heat produced by the hermetic display units during operation can only dissipate into the external environment via the casings of the display units. In the event the heat dissipation efficiency is poor, the display units are subjected to failure when excessive heat is accumulated in the casings.

It is therefore tried by the inventor to develop a water barrier structure for display unit, which not only provides good water barrier effect, but also good heat dissipation effect.

SUMMARY OF THE INVENTION

It is a primary object of the present invention to provide a water barrier structure for display unit. Unlike the conventional sealing structure having poor heat removal efficiency, the water barrier structure of the present invention not only provides good water barrier effect, but also good heat dissipation effect, and can therefore effectively solve the problem of the outdoor display unit that is easily failed after operating in a hermetic high-temperature environment over a long time.

To achieve the above and other objects, the water barrier structure for display unit according to the present invention is arranged on one lateral side of a casing of the display unit. In the casing, there are received an illuminating module and a display module of the display unit; and the lateral side is provided with at least one air inlet and at least one air outlet. The water barrier structure includes at least one intake fan mounted in the at least one air inlet; at least one exhaust fan mounted in the at least one air outlet; and a plurality of waterproof caps used to cover the at least one air inlet and the at least one air outlet.

In an embodiment of the present invention, the at least one air inlet is arranged below the at least one air outlet.

In an embodiment of the present invention, the waterproof caps respectively include an external inclined panel, a plurality of internal slant plates being mounted in the waterproof cap in a staggered and generally zigzag manner, and a plurality of air vents being formed on a bottom of the waterproof cap.

In an embodiment of the present invention, the outer cover further includes a plurality of water guiding shields, which are respectively outward and downward extended from the upper sides of the convection openings; and a plurality of drain holes formed on a bottom of the outer cover.

In an embodiment of the present invention, the water barrier structure further includes an outer cover being mounted to the lateral side of the casing to shield the waterproof caps; and the outer cover is formed with a plurality of convection openings.

In an embodiment of the present invention, the water barrier structure further includes a plurality of dust caps being respectively arranged between the at least one intake fan and a corresponding waterproof cap or between the at least one exhaust fan and a corresponding waterproof cap.

In an embodiment of the present invention, the casing further includes a removable maintenance door.

In an embodiment of the present invention, the display module is a double-sided display module.

With the specially structured intake fan, exhaust fan and waterproof caps, the water barrier structure of the present invention can provide good water barrier effect while allows heat in the casing produced by the display unit to be effectively removed from the casing through air convection.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
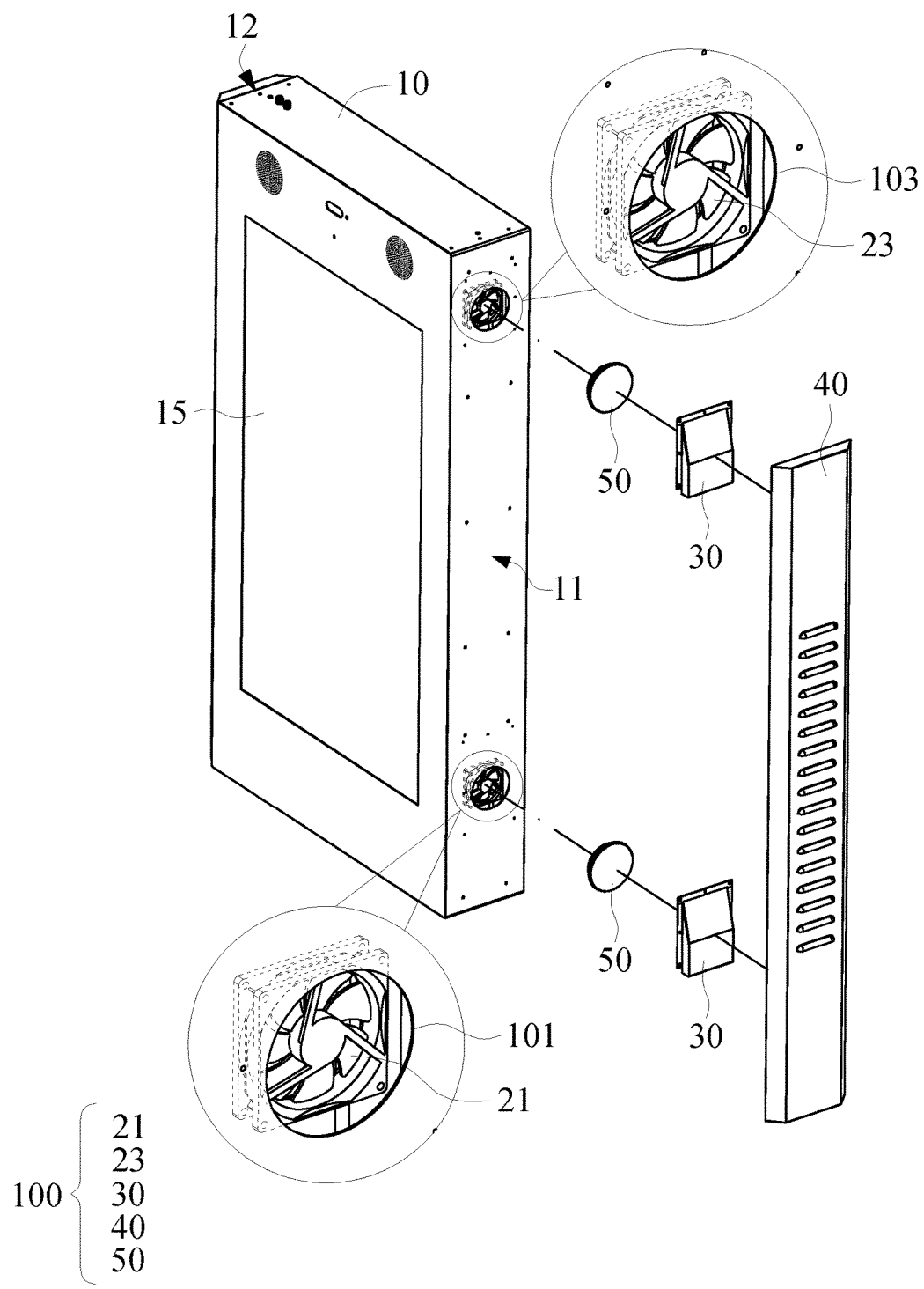
FIG. 1 is a partially exploded perspective view showing a water barrier structure according to an embodiment of the present invention and a display unit using the water barrier structure.

The present invention will now be described with some preferred embodiments thereof and by referring to the accompanying drawings. For the purpose of easy to understand, elements that are the same in the preferred embodiments are denoted by the same reference numerals. The objects, features and advantages of the present invention are hereunder illustrated with specific embodiments in conjunction with the accompanying drawings. The present invention can be implemented or applied in accordance with any other variant embodiments. Various modifications and changes may be made to the details described in the specification from different perspectives and for different applications without departing from the spirit of the present invention. The accompanying drawings are deemed illustrative and thus are not drawn to scale. The embodiments presented below are illustrative of the technical features of the present invention rather than restrictive of the claims of the present invention.

Figure 2:
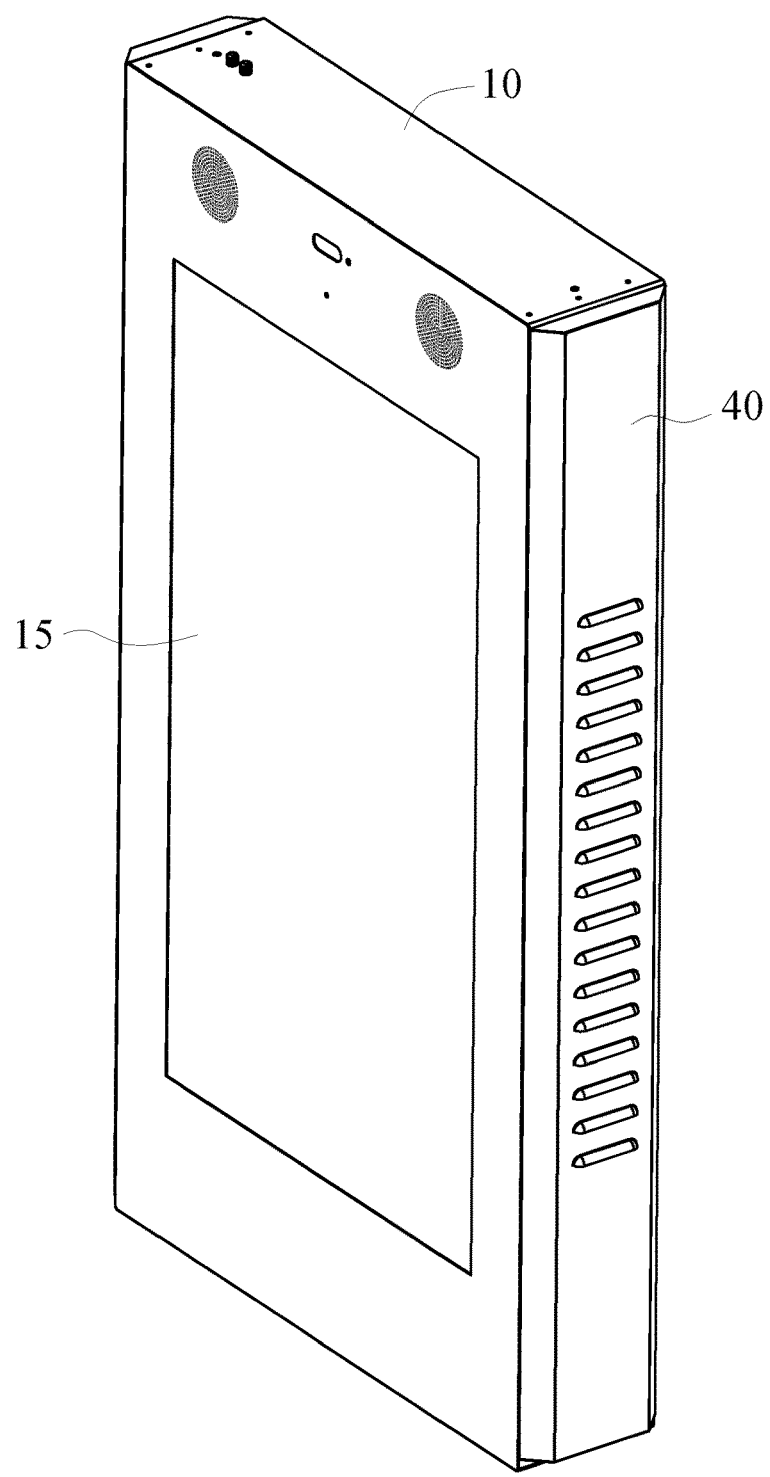
FIG. 2 is a fully assembled perspective view of FIG. 1.

FIG. 1 is a partially exploded perspective view showing a water barrier structure 100 according to an embodiment of the present invention and a display unit using the water barrier structure 100, and FIG. 2 is a fully assembled perspective view of FIG. 1. Please refer to FIGS. 1 and 2. The water barrier structure 100 is arranged on one lateral side 11 of a casing 10 of the display unit. The casing 10 is used to receive an illuminating module and a display module (not shown) of the display unit therein. The lateral side 11 is provided with at least one air inlet 101 and at least one air outlet 103. In the illustrated embodiment of the present invention, the water barrier structure 100 includes at least one intake fan 21, at least one exhaust fan 23 and a plurality of waterproof caps 30

It is to be noted the structures of the illuminating module and the display module are determined according to the type of the display unit. For instance, the display unit can be a liquid crystal display (LCD) or an organic light-emitting diode (OLED) display; and the display module can be a double-sided display module. In the present invention, there is not any particular restriction to the type of the display unit.

In the illustrated embodiment of the present invention, two sides of the casing 10 are shown, namely, a lateral side 11 and a top side 12. And, in FIG. 1, while one air inlet 101 and one air outlet 103 are shown on the lateral side 11, it is understood the top side 12 can also be provided with the same structures corresponding to the lateral side 11. Further, in the present invention, there is not any particular limit to the number of the air inlet 101 and of the air outlet 103. The number of the air inlet 101 and of the air outlet 103 can be adjusted according to actual need in practical application.

The at least one intake fan 21 is mounted in the at least one air inlet 101, and the at least one exhaust fan 23 is mounted in the at least one air outlet 103. In the illustrated embodiment, since air heated by the heat energy produced by the display unit has a rising temperature and will move upward in the casing 10, the at least one air inlet 101 is arranged below the at least one air outlet 103. This arrangement allows the at least one intake fan 21 to suck external air having a lower temperature into the casing 10, while the at least one exhaust fan 23 can more quickly draw and expel hot air in the casing 10 to the external environment. With these arrangements, the water barrier structure 100 can provide good heat dissipation effect, and good air convection in the casing 10 can be formed. Similarly, there is not any particular limit to the number of the intake fan 21 and of the exhaust fan 23. More specifically, the number of the intake fan 21 and of the exhaust fan 23 should be determined according to the number of the air inlet 101 and of the air outlet 103, respectively.

According to an operable embodiment of the present invention, the casing 10 includes a removable maintenance door 15. In the case any of the elements mounted in the casing 10, such as the illuminating module or the display module of the display unit, or any one of the at least one intake fan 21 and the at least one exhaust fan 23 is failed, the removable maintenance door 15 can be removed from the casing 10 to facilitate necessary repair or replacement of the failed element.

In the illustrated embodiment of the present invention, the waterproof caps 30 are used to cover the at least one air inlet 101 and the at least one air outlet 103. Since the at least one air inlet 101 and the at least one air outlet 103 are the paths via which the water barrier structure 100 communicates with the environment outside the casing 10, the waterproof caps 30 are designed to stop rainwater from entering into the casing 10 via the at least one air inlet 101 and the at least one air outlet 103, lest any of the elements in the casing 10, such as the illuminating module and the display module, should be damaged and failed due to the intruded rainwater According to a preferred embodiment of the present invention, the water barrier structure 100 further includes an outer cover 40. The outer cover 40 is mounted to the lateral side 11 of the casing 10 to shield the waterproof caps 30. Similarly, in the case the top side 12 of the casing 10 has the same structures provided thereon corresponding to the lateral side 11, another outer cover 40 can also be mounted to the top side 12 for shielding the waterproof caps 30. The outer cover 40 not only prevents the waterproof caps 30 and the at least one air inlet 101 and the at least one air outlet 103 covered by the waterproof caps 30 from being in direct contact with rainwater, but also gives the entire water barrier structure 100 a neat and esthetic outer appearance According to the above preferred embodiment, the outer cover 40 is formed with a plurality of convection openings 41 (see FIG. 4). The convection openings 41 serve as passages via which air flows. For example, when the at least one exhaust fan 23 expels the relatively hot air in the casing 10 out to the outer cover 40, the expelled hot air can further pass through the convection openings 41 into the environment outside the water barrier structure 100. On the other hand, ambient cold air having a relatively lower temperature can also flow through the convection openings 41 into the outer cover 40 and is then guided by the at least one intake fan 21 into the casing 10.

Figure 3:
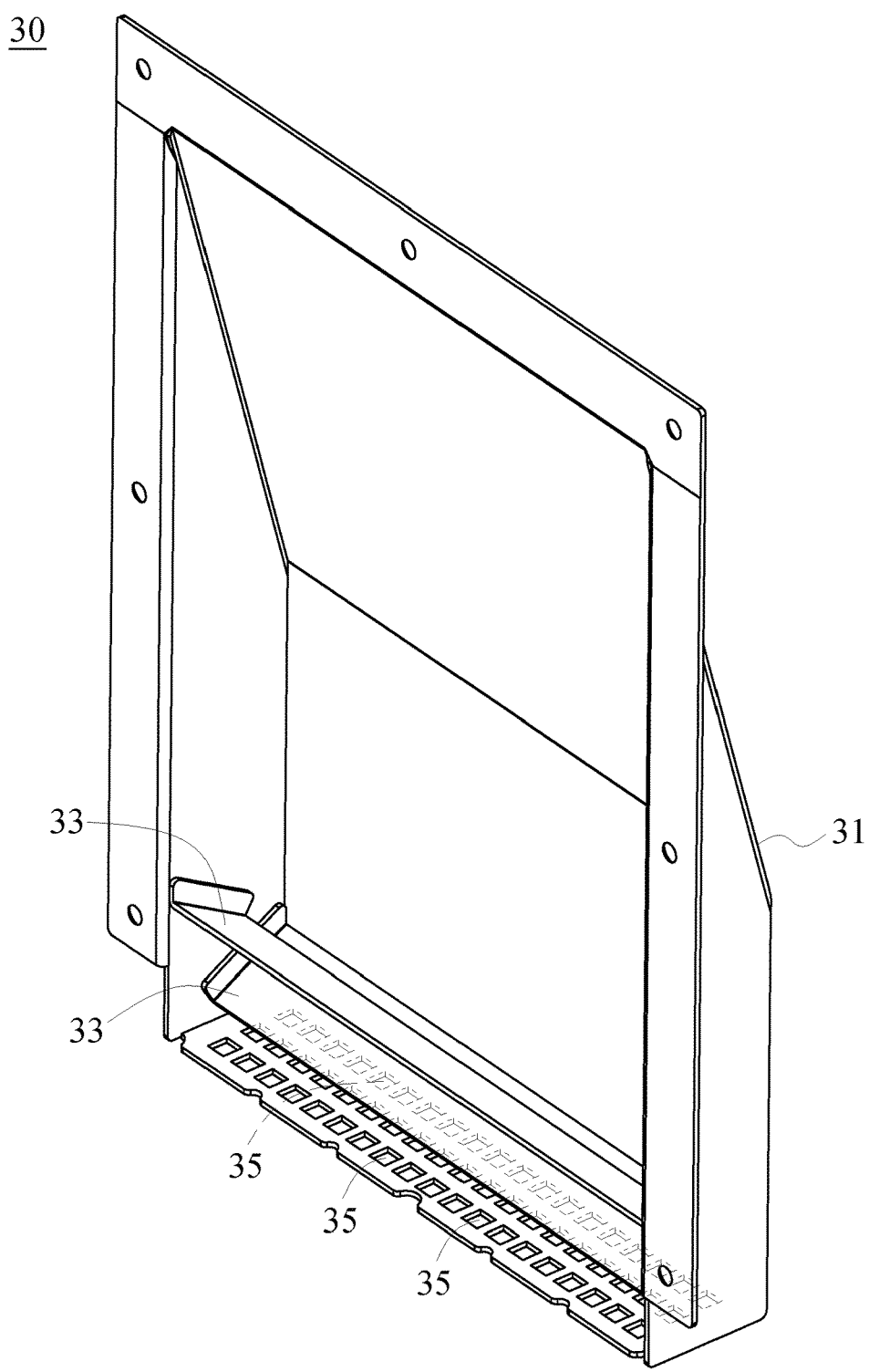
FIG. 3 is a perspective view of a waterproof cap included in the water barrier structure of the present invention shown in FIG. 1.

FIG. 3 is a perspective view of the water-stop cap 30 included in the water barrier structure 100 according to the embodiment of the present invention shown in FIG. 1. As shown in FIG. 3, each of the water-stop caps 30 includes an external inclined panel 31, a plurality of internal slant plates 33, and a plurality of air vents 35. The internal slant plates 33 are mounted in the water-stop cap 30 in a staggered and generally zigzag manner. The air vents 35 are formed on a bottom of the water-stop cap 30. In general conditions, the water-stop caps 30 and the outer cover 40 are sufficient for stopping dropped rainwater from entering thereinto. However, it is still possible water is upward forced into the water-stop caps 30 and the outer cover 40 due to strong wind or other man-made factors, such as washing the casing 10 of the display unit. The external inclined panel 31 is designed for water that has entered into the outer cover 40 to downward flow along the external inclined panel 31 without entering into the casing 10 via the at least one air inlet 101 and the at least one air outlet 103.

FIG. 3 is a perspective view of the waterproof cap 30 included in the water barrier structure 100 according to the embodiment of the present invention shown in FIG. 1. As shown in FIG. 3, each of the waterproof caps 30 includes an external inclined panel 31, a plurality of internal slant plates 33, and a plurality of air vents 35. The internal slant plates 33 are mounted in the waterproof cap 30 in a staggered and generally zigzag manner. The air vents 35 are formed on a bottom of the waterproof cap 30. In general conditions, the waterproof caps 30 and the outer cover 40 are sufficient for stopping dropped rainwater from entering thereinto. However, it is still possible water is upward forced into the waterproof caps 30 and the outer cover 40 due to strong wind or other man-made factors, such as washing the casing 10 of the display unit. The external inclined panel 31 is designed for water that has entered into the outer cover 40 to downward flow along the external inclined panel 31 without entering into the casing 10 via the at least one air inlet 101 and the at least one air outlet 103.

The air vents 35 allow the relatively hot air in the casing 10 to flow out into external environment via the waterproof caps 30, and allow the relatively cold ambient air to flow into the casing 10 via the waterproof caps 30. In the event water is upward forced into the waterproof caps 30 due to strong wind or other man-made factors, such as washing the casing 10 of the display unit, the internal slant plates 33 mounted in the waterproof caps 30 in the staggered and zigzag manner can further stop water from entering into the casing 10 via the at least one air inlet 101 and the at least one air outlet 103. That is, the water accidentally entered into the waterproof caps 30 will flow down along the internal slant plates 33 and leave the waterproof caps 30 via the air vents 35.

Figure 4:
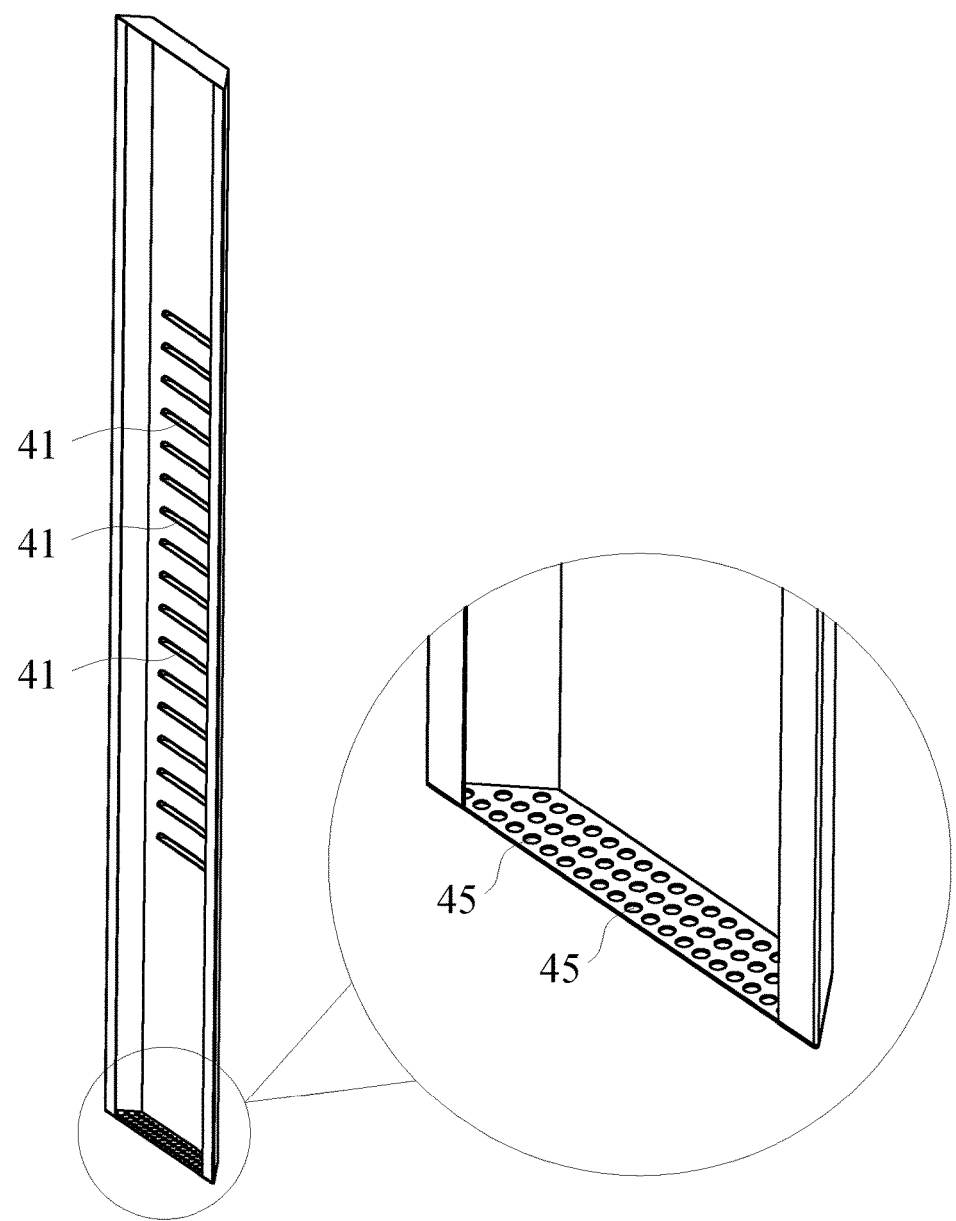
FIG. 4 is a perspective view of an outer cover included in the water barrier structure of the present invention shown in FIG. 1.
Figure 5:
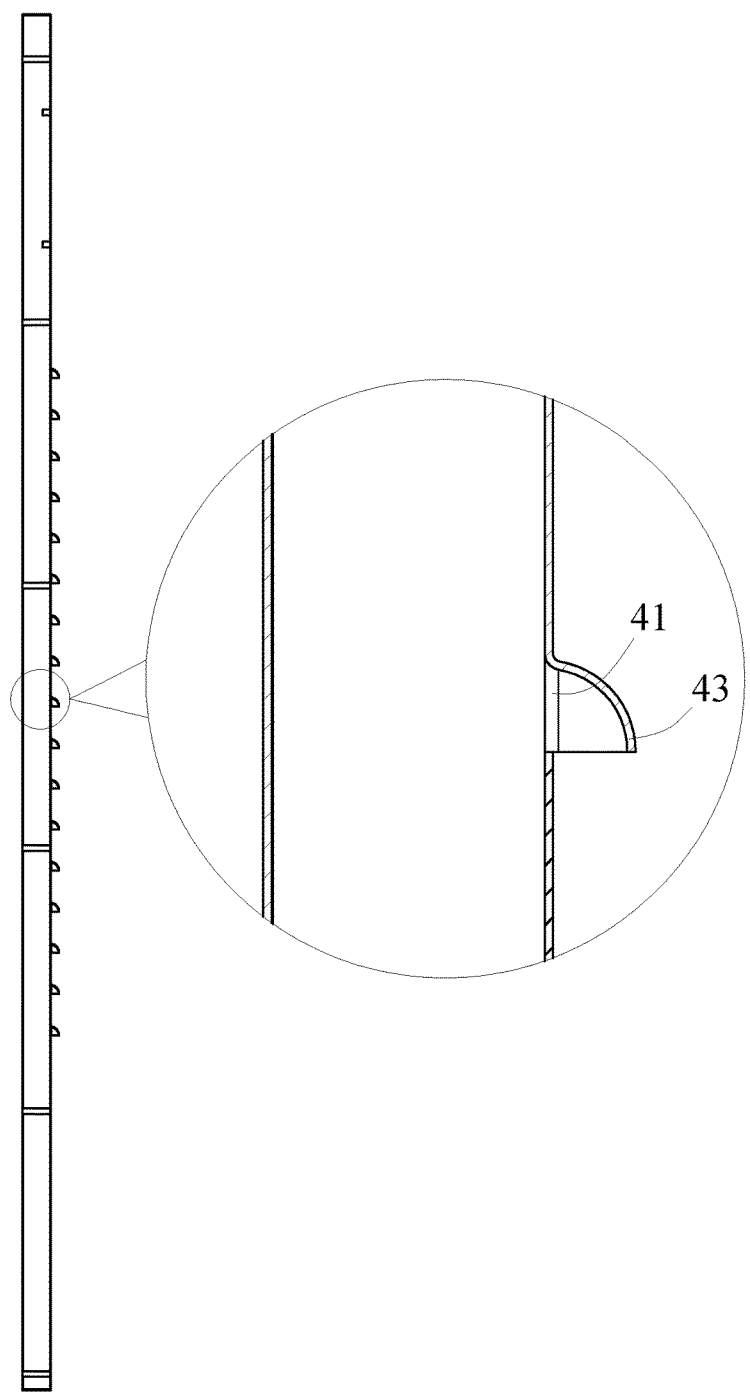
FIG. 5 is a partially sectioned side view of the outer cover of FIG. 4.

FIG. 4 is a perspective view of the outer cover 40 included in the water barrier structure 100 according to the embodiment of the present invention shown in FIG. 1; and FIG. 5 is a partially sectioned side view of the outer cover 40 of FIG. 4. Please refer to FIGS. 4 and 5. The outer cover 40 of the water barrier structure 100 further includes a plurality of water guiding shields 43 and a plurality of drain holes 45. The water guiding shields 43 are respectively outward and downward extended from upper sides of the convection openings 41. This design effectively prevents the dropping rainwater from entering into the outer cover 40 via the convection openings 41. The drain holes 45 are formed on a bottom of the outer cover 40. Any water that is upward forced into the outer cover 40 due to strong wind or other man-made factors, such as washing the casing 10 of the display unit, can flow down along the external inclined panel 31 of the waterproof cap 30 or drop due to the gravity force, and is finally drained from the outer cover 40 via the drain holes 45.

Also, the hot air having a relatively higher temperature expelled out from the casing 10 and flowing through the air vents 35 of the waterproof cap 30 can further flow out of the outer cover 40 via the convection openings 41 and the drain holes 45. Similarly, the cold air having a relatively lower temperature outside the casing 10 can also be guided into the casing 10 via the convection openings 41 and the drain holes 45 of the outer cover 40. That is, the outer cover 40 would not form a hindrance to the air convection in the casing 10 via the at least one intake fan 21, the at least one exhaust fan 23 and the waterproof caps 30 of the water barrier structure 100.

According to another preferred embodiment of the present invention, the water barrier structure 100 further includes a plurality of dust caps 50 (see FIG. 1). One of the dust caps 50 is arranged between the at least one intake fan 21 and its corresponding waterproof cap 30, and another one of the dust caps 50 between the at least one exhaust fan 23 and its corresponding waterproof cap 30. The dust caps 50 can further stop dust from entering into the casing 10 via the at least one air inlet 101 and the at least one air outlet 103. Similarly, when it is necessary to replace any of the duct caps 50, first remove the removable maintenance door 15 from the casing 10 and then remove the intake fan 21 or the exhaust fan 23 that is located corresponding to the dust cap 50 to be replaced. Thereafter, the dust cap 50 can be conveniently replaced with a new one.

In summary, with the particularly designed structure of the at least one intake fan 21, the at least one exhaust fan 23, the waterproof caps 30, and, in some embodiments, the outer cover 40 of the water barrier structure for display unit according to the present invention, the heat produced by the display unit and accumulated in the casing 10 can be effectively removed from the casing 10 through air convection. That is, the water barrier structure 100 provides good heat dissipation effect. Meanwhile, the special structural design of the waterproof caps 30 and the outer cover 40 also effectively stops water from entering into the casing 10 via the at least one air inlet 101 and the at least one air outlet 103. Therefore, the water barrier structure 100 also provides good water barrier effect.

While the present invention is described with an embodiment in which the at least one intake fan 21, the at least one exhaust fan 23, the waterproof caps 30 and the outer cover 40 are arranged on one lateral side 11 of the casing 10, it is understood these elements can be otherwise arranged on the top side 12 of the casing 10 for the water barrier structure 100 to provide an even better heat dissipation effect and have a fully symmetric and esthetic outer appearance.

The present invention has been described with a preferred embodiment thereof and it is understood that the preferred embodiment is only illustrative and not intended to limit the present invention in any way and many changes and modifications in the described embodiment can be carried out without departing from the scope and the spirit of the invention that is intended to be limited only by the appended claims.

What is claimed is:

1. A water barrier structure comprising:
a casing;
at least one air inlet being arranged on one lateral side of the casing;
at least one air outlet being arranged on the lateral side of the casing;
a plurality of waterproof caps being used to cover the at least one air inlet and the at least one air outlet, wherein the waterproof caps respectively include an external inclined panel; a plurality of internal slant plates being mounted in the waterproof cap in a staggered and generally zigzag manner; and a plurality of air vents being formed on a bottom of the waterproof cap; and
an outer cover being mounted to the lateral side of the casing to shield the waterproof caps; and the outer cover being formed with a plurality of convection openings.

2. A water barrier structure comprising:
a casing;
at least one air inlet being arranged on one lateral side of the casing;
at least one air outlet being arranged on the lateral side of the casing;
a plurality of waterproof caps being used to cover the at least one air inlet and the at least one air outlet;
a plurality of dust caps being respectively arranged between the at least one intake fan and a corresponding waterproof cap and between the at least one exhaust fan and a corresponding waterproof cap; and
an outer cover being mounted to the lateral side of the casing to shield the waterproof caps; and the outer cover being formed with a plurality of convection openings.

3. A water barrier structure comprising:
a casing, including a removable maintenance door;
at least one air inlet being arranged on one lateral side of the casing;
at least one air outlet being arranged on the lateral side of the casing;
a plurality of waterproof caps being used to cover the at least one air inlet and the at least one air outlet; and
an outer cover being mounted to the lateral side of the casing to shield the waterproof caps; and the outer cover being formed with a plurality of convection openings.

4. A water barrier structure comprising:
a casing;
at least one air inlet being arranged on one lateral side of the casing;
at least one air outlet being arranged on the lateral side of the casing;
a plurality of waterproof caps being used to cover the at least one air inlet and the at least one air outlet; and
an outer cover being mounted to the lateral side of the casing to shield the water-stop caps; and
the outer cover being formed with a plurality of convection openings;
wherein the outer cover further includes:
a plurality of water guiding shields being respectively outward and downward extended from upper sides of the convection openings; and
a plurality of drain holes being formed on a bottom of the outer cover.

5. A water barrier structure comprising:
a casing;
at least one air inlet being arranged on one lateral side of the casing;
at least one air outlet being arranged on the lateral side of the casing, wherein the at least one air inlet is arranged below the at least one air outlet;
a plurality of waterproof caps being used to cover the at least one air inlet and the at least one air outlet; and
an outer cover being mounted to the lateral side of the casing to shield the water-stop caps; and the outer cover being formed with a plurality of convection openings;
wherein the outer cover further includes:
a plurality of water guiding shields being respectively outward and downward extended from upper sides of the convection openings; and
a plurality of drain holes being formed on a bottom of the outer cover.

6. The water barrier structure as claimed in claim 1, wherein the outer cover further includes:
a plurality of water guiding shields being respectively outward and downward extended from upper sides of the convection openings; and
a plurality of drain holes being formed on a bottom of the outer cover.

7. The water barrier structure as claimed in claim 2, wherein the outer cover further includes:
a plurality of water guiding shields being respectively outward and downward extended from upper sides of the convection openings; and
a plurality of drain holes being formed on a bottom of the outer cover.

8. The water barrier structure as claimed in claim 3, wherein the outer cover further includes:
a plurality of water guiding shields being respectively outward and downward extended from upper sides of the convection openings; and
a plurality of drain holes being formed on a bottom of the outer cover.

* * * * *